US008993358B2

(12) United States Patent
Mei et al.

(10) Patent No.: US 8,993,358 B2
(45) Date of Patent: *Mar. 31, 2015

(54) DEPOSITION OF PHOSPHOR ON DIE TOP BY STENCIL PRINTING

(75) Inventors: Zequn Mei, Fremont, CA (US); Xiantao Yan, Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 39 days.

This patent is subject to a terminal disclaimer.

(21) Appl. No.: 13/338,912

(22) Filed: Dec. 28, 2011

(65) Prior Publication Data

US 2013/0168703 A1    Jul. 4, 2013

(51) Int. Cl.
*H01L 21/00* (2006.01)
*H01L 33/50* (2010.01)

(52) U.S. Cl.
CPC ......... *H01L 33/50* (2013.01); *H01L 2933/0041* (2013.01)
USPC .................. 438/28; 438/22; 438/26; 438/29; 257/88; 257/E21.032

(58) Field of Classification Search
USPC ............ 257/88, E21.032; 438/22, 26, 28, 33, 438/29, 82, 99
See application file for complete search history.

(56) References Cited

U.S. PATENT DOCUMENTS

| 4,514,489 | A | 4/1985 | Garcia et al. | |
|---|---|---|---|---|
| 6,650,044 | B1 | 11/2003 | Lowery | |
| 6,682,331 | B1 | 1/2004 | Peh et al. | |
| 7,049,159 | B2 | 5/2006 | Lowery | |
| 8,330,176 | B2 | 12/2012 | Thompson et al. | |
| 8,399,268 | B1 | 3/2013 | Mei et al. | |
| 2002/0053515 | A1 | 5/2002 | Nemelka | |
| 2003/0080341 | A1 | 5/2003 | Sakano et al. | |
| 2003/0230753 | A1* | 12/2003 | Steckl et al. | 257/89 |
| 2006/0170332 | A1 | 8/2006 | Tamaki et al. | |
| 2007/0062032 | A1* | 3/2007 | Ter-Hovhannissian | 29/840 |
| 2007/0178629 | A1* | 8/2007 | Ogawa et al. | 438/113 |
| 2008/0035942 | A1 | 2/2008 | Kim et al. | |
| 2008/0076316 | A1 | 3/2008 | Negley | |
| 2008/0203415 | A1* | 8/2008 | Thompson et al. | 257/98 |

(Continued)

FOREIGN PATENT DOCUMENTS

WO   WO2010023993           3/2010
WO   WO 2010029876 A1 *     3/2010

OTHER PUBLICATIONS

Notice of Allowance for U.S. Appl. No. 13/338,936, mailed Jan. 22, 2013, 8 pages.

(Continued)

*Primary Examiner* — Yu-Hsi D Sun
*Assistant Examiner* — Lauren R Bell
(74) *Attorney, Agent, or Firm* — Kilpatrick Townsend & Stockton LLP

(57) ABSTRACT

A method for depositing a layer of phosphor-containing material on a plurality of LED dies includes disposing a template with a plurality of openings on an adhesive tape and disposing each of a plurality of LED dies in one of the plurality of openings of the template. The method also includes disposing a stencil over the template and the plurality of LED dies. The stencil has a plurality of openings configured to expose a top surface of each of the LED dies. Next, a phosphor-containing material is disposed on the exposed top surface of each the LED dies. The method further includes removing the stencil and the template.

12 Claims, 8 Drawing Sheets

(56) References Cited

U.S. PATENT DOCUMENTS

| | | | |
|---|---|---|---|
| 2008/0290351 A1* | 11/2008 | Ajiki et al. | 257/88 |
| 2009/0057701 A1 | 3/2009 | Chao | |
| 2009/0176324 A1 | 7/2009 | Tsai | |
| 2010/0181582 A1 | 7/2010 | Li et al. | |
| 2010/0252845 A1 | 10/2010 | Lin et al. | |
| 2010/0317132 A1 | 12/2010 | Rogers et al. | |
| 2011/0073882 A1 | 3/2011 | Xu | |
| 2011/0189808 A1* | 8/2011 | Watanabe et al. | 438/66 |
| 2012/0068209 A1* | 3/2012 | Andrews | 257/98 |
| 2012/0104450 A1 | 5/2012 | Chen et al. | |
| 2012/0142124 A1* | 6/2012 | Yoo et al. | 438/16 |

OTHER PUBLICATIONS

Requirement for Restriction/Election for U.S. Appl. No. 13/338,936, mailed of Nov. 23, 2012, 4 pages.

Search Report for European patent application EP12199365 dated Apr. 22, 2013.

Search Report for European patent application EP12199069 dated Jun. 26, 2013.

International Search Report for application PCT/US2012/22745 (Jun. 20, 2014).

Non-Final Office Action for U.S. Appl. No. 13/842,127, mailed on Jun. 19, 2014, 9 pages.

* cited by examiner

DEPOSITION OF PHOSPHOR ON DIE TOP BY STENCIL PRINTING

CROSS-REFERENCES TO RELATED APPLICATIONS

This application is related to concurrently-filed U.S. patent application Ser. No. 13/338,936, filed Dec. 28, 2011, now U.S. Pat. No. 8,399,268, Titled "DEPOSITION OF PHOSPHOR ON DIE TOP USING DRY FILM PHOTORESIST", commonly owned and incorporated herein by reference in its entirety.

BACKGROUND OF THE INVENTION

The present invention relates in general to light-emitting diodes (LEDs) and in particular to deposition of phosphor-containing material on LED dies for light color selection.

With the incandescent light bulb producing more heat than light, the world is eager for more efficient sources of artificial light. LEDs are a promising technology and are already widely deployed for specific purposes, such as traffic signals and flashlights. For colored light, an LED chip is often combined with a wavelength-converting material to obtain desired output light color. For example, yellow phosphors are often combined with blue LEDs to produce white light. However, the development of LED-based lamps for general illumination has run into various difficulties. Among these is the difficulty of mass-producing LED emitters with phosphors that provide a consistent light color.

Conventional LED emitters often include an LED die in a recess or cup structure that has phosphor-containing material in the cup. In some cases, the phosphor-containing material is separated from the LED die by, for example, a silicone material. These conventional methods tend suffer from many drawbacks. For example, conventional methods often use a large amount of phosphor, and they may cause poor cooling of the phosphor and the silicone material. As a result, the emitter can suffer from less reliable packaging and non-uniform angular distribution of light color. Given existing processes for LED manufacture, mass-producing white LEDs with a consistent color temperature has proven to be a challenge.

BRIEF SUMMARY OF THE INVENTION

Embodiments of the present invention relate to methods for placing controlled amount of phosphor-containing material on top of LED dies. In some embodiments, a plurality of LED dies are placed in openings of a template. The phosphor-containing material of suitable viscosity is applied, e.g., by printing, and then excess material is removed using the template as a guide. The size of the opening limits the phosphor-containing material to only the exposed top surface of the LED dies, and the height of the template help control the thickness of the phosphor-containing material. A stencil can be used to mask out areas of the die where no phosphor-containing material is desired.

The methods described herein have many advantages can be achieved over conventional techniques. The methods use conventional equipment and processes and are suitable for cost-effective mass production. The phosphor usage is reduced, since phosphor is placed only on the top surface of the LED die. Heat generated in the phosphor material can be dissipated through the LED die, and better cooling can reduce the temperature of the phosphor and the silicone material and lead to more reliable package. In contrast, a conventional method of placing phosphor on die top involves using a syringe to place liquid droplets of phosphor material. One drawback of this method is that the liquid mixture tends to settle and can lead to color shifting. In the methods according to the present invention, the mixture of phosphor-containing material is formed to desired viscosity before being applied to the template.

According to an embodiment, a method for depositing a layer of phosphor-containing material on a plurality of LED dies includes disposing a template with a plurality of openings on an adhesive tape and disposing each of a plurality of LED dies in one of the plurality of openings of the template. The method also includes disposing a stencil over the template and the plurality of LED dies. The stencil has a plurality of openings configured to expose a top surface of each of the LED dies, but can shield surface areas for bonding pads, etc. Next, a phosphor-containing material is disposed on the exposed top surface of each the LED dies. The method further includes removing the stencil and the template.

In a specific embodiment of the above method, the adhesive tape is placed on a glass plate. The adhesive tape can be a heat release tape or a UV release tape. In some embodiments, the area of the openings in the template is approximately equal to the size of the LED dies. The thickness of the openings in the template is substantially equal to a thickness of the LED dies. In some embodiments, the stencil is configured to cover bond pad areas on the LED dies. In some embodiments, the method includes depositing the phosphor-containing material on the stencil and the LED dies and removing the phosphor-containing material from the top surface of the stencil and on the top surface of the LED dies that protrudes above the top surface of the stencil. In an embodiment, the depth of the openings in the stencil is equal to a desired thickness of the phosphor-containing material. In order to allow removal of the stencil after phosphor deposition, the stencil can be coated with Teflon.

A further understanding of the nature and advantages of the present invention may be more appreciated by reference to the detailed description in the remaining portions of the specification and accompanying drawings that follow.

BRIEF DESCRIPTION OF THE DRAWINGS

FIG. 1 shows a substrate for carrying out the method for phosphor deposition according to an embodiment of the present invention;

FIGS. 2 and 3 show a grid template for carrying out the method for phosphor deposition according to an embodiment of the present invention;

FIG. 4 illustrates the process of LED chips being placed into the grid openings of the template;

FIG. 5 illustrates a stencil placed over the template and the LED chips;

FIG. 6 illustrates a phosphor-containing mixture deposited over the stencil;

FIG. 7 shows curing the intermediate structure including a glass plate, a template over the plate, LED chips disposed in openings in the template, a stencil with a phosphor-containing mixture filling the openings in the stencil and over the exposed top surface of the LED chips;

FIG. 8 shows the structure in FIG. 7 with the stencil removed;

FIG. 9 shows a structure including a plurality of separate LED dies attached to an adhesive tape, each of the LED dies having a layer of phosphor-containing material.

DETAILED DESCRIPTION OF THE INVENTION

The description below will be made with reference to a series of drawing figures enumerated above. These diagrams are merely an example, which examples, and should not unduly limit the scope of the claims herein. In connection with the various aspects illustrated and described, one of ordinary skill in the art would recognize other variations, modifications, and alternatives.

Figure 1:
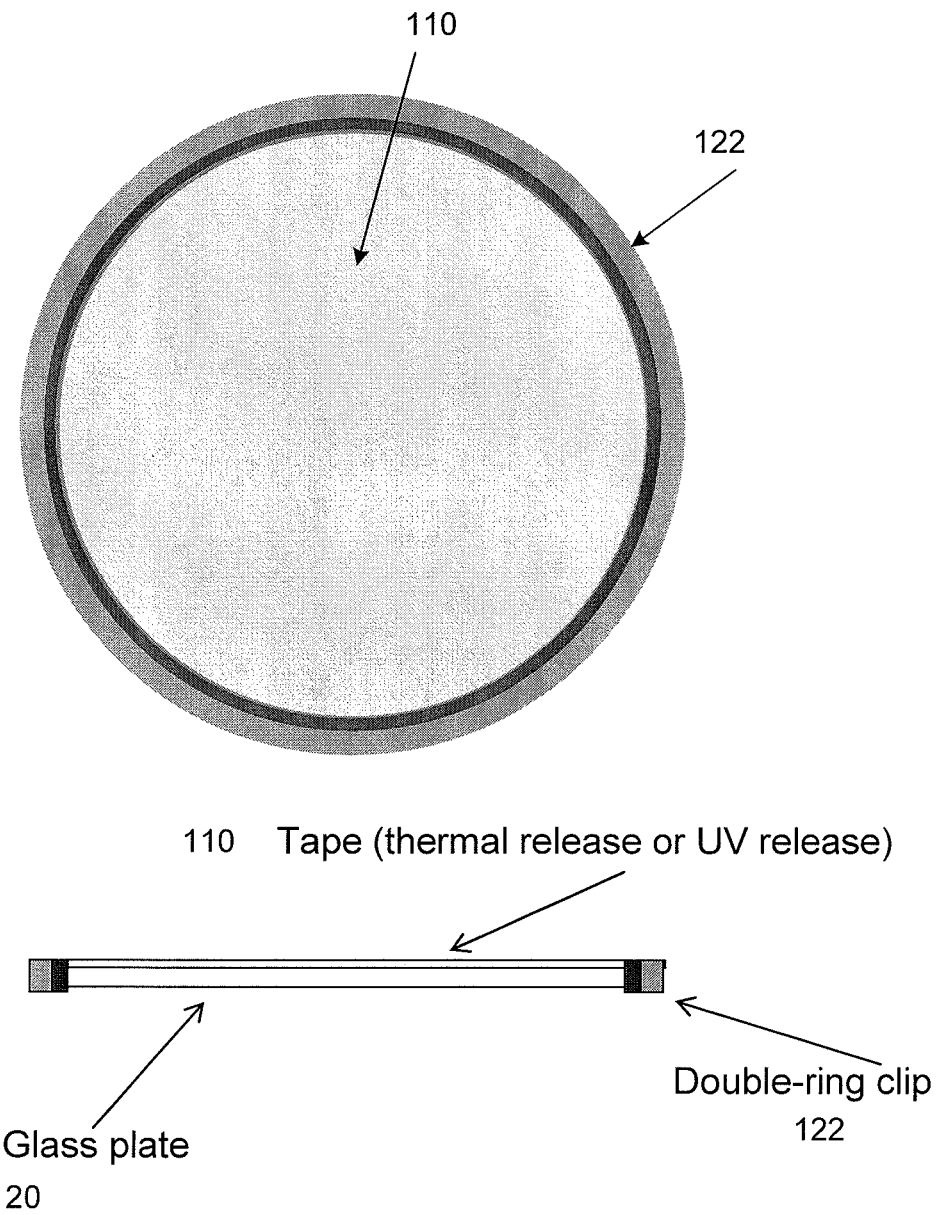
FIGS. 1-9 are cross-sectional diagrams illustrating a method for carrying out a method for phosphor deposition according to an embodiment of the present invention.

FIG. 1 shows a top view and a cross-sectional view of a substrate for carrying out the method for phosphor deposition. An adhesive tape 110 is disposed on a glass plate 120. In an embodiment, the tape can be a single sided adhesive tape, which can be a thermal release or a UV release tape made of polyester. For example, a commercially available tape from Semiconductor Equipment Corp. can be used. Tape 110 is stretched over the glass substrate and held in place with a double-ring clip. In FIG. 1, plate 120 is shown as a round glass plate, but a plate made of an insulating solid of another suitable shape can also be used. As shown in FIG. 1, tape 110 is fastened to glass substrate 120 by a double-ring clip 122.

Figure 2:
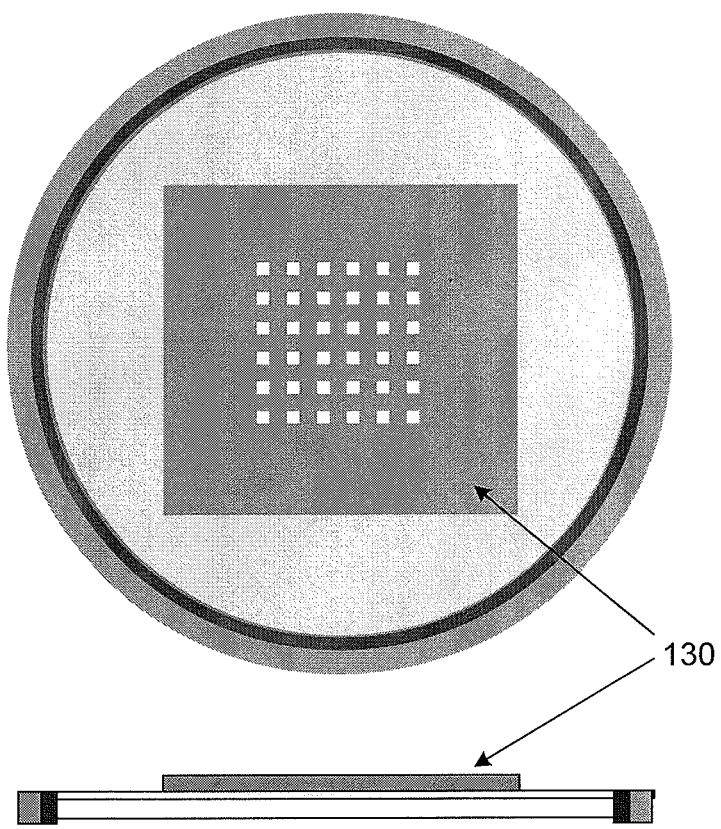
Figure 3:
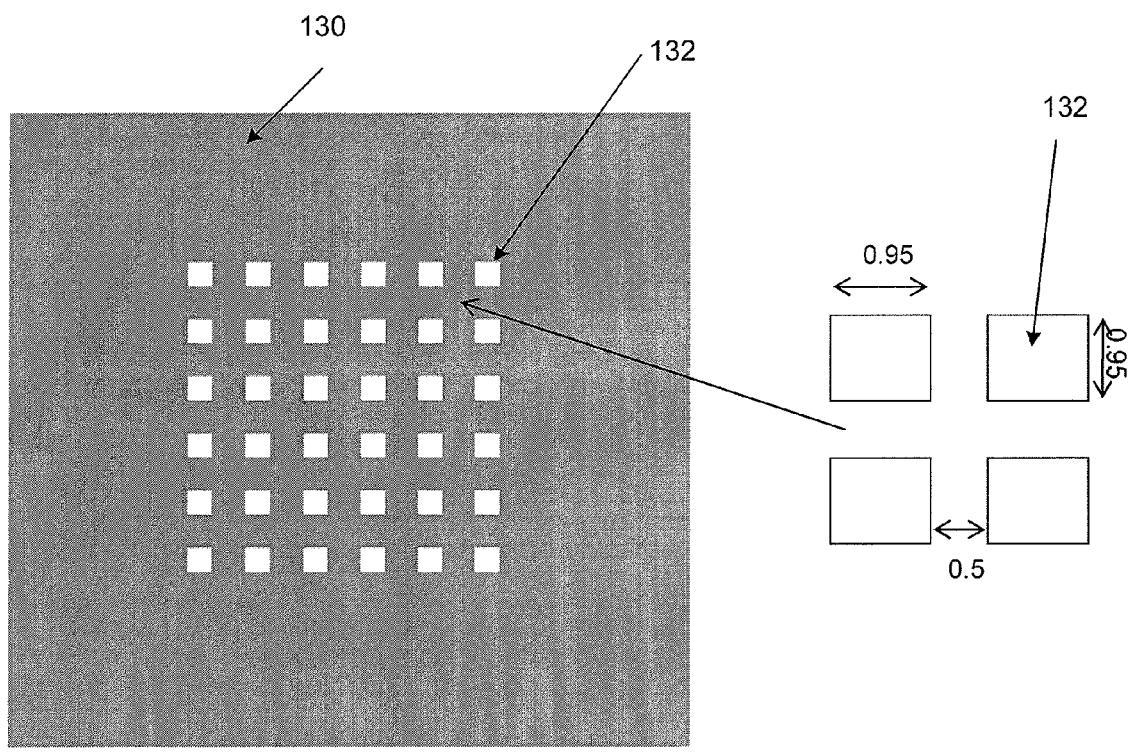

Next, as shown in FIG. 2, a grid template 130 is disposed on the adhesive top side of tape 110. In the example of FIG. 2, the grid template includes openings arranged in a 6×6 array. However, depending on the application, the grid template can have other grid patterns, e.g. 30×30. In some embodiments, the grid template is a metal plate with square openings. The opening is slightly larger than an LED chip size, and the plate thickness is the same as the chip thickness. A specific example of the template 130 is shown in FIG. 3, where the size of the opening 132 is 0.95 mm by 0.95 mm for an LED chip of size 0.9 mm by 0.9 mm. In this example, the spacing between openings is 0.5 mm, and the plate thickness is 0.17 mm. Of course, these dimensions can be varied.

Figure 4:
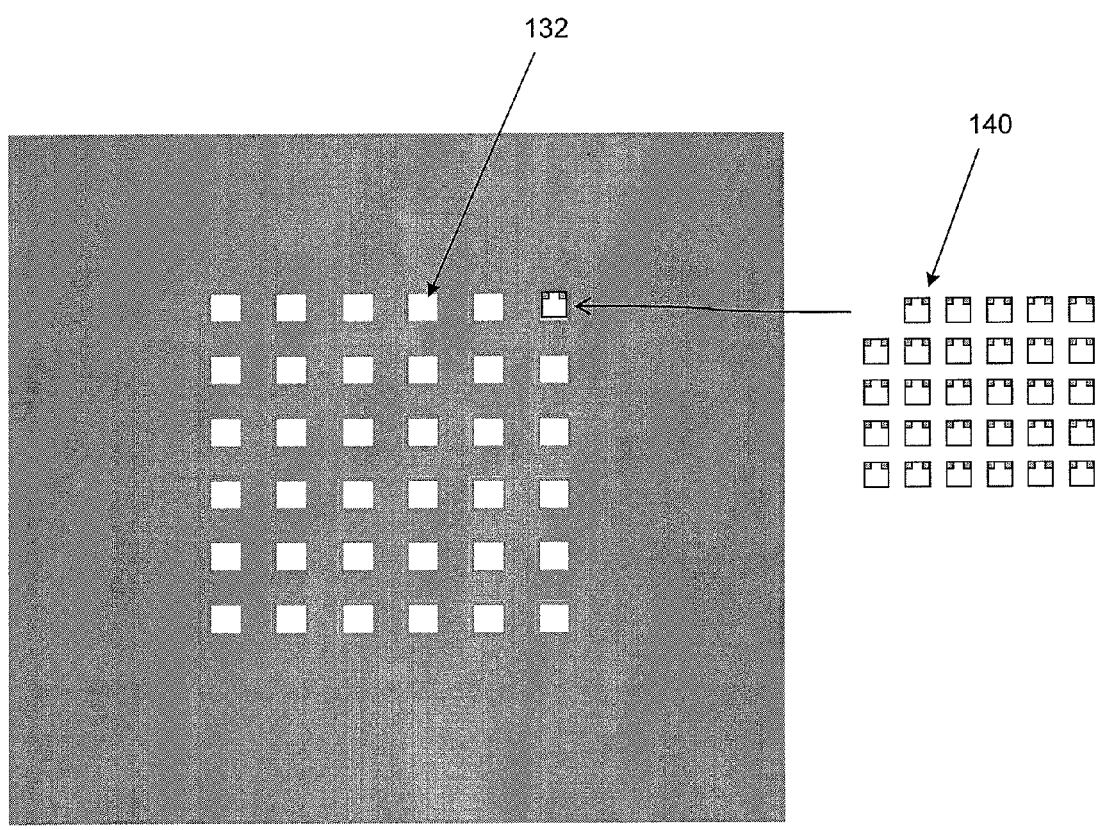

In FIG. 4, individual LED chips 140 are placed into the grid openings. For example, a pick-and-place tool can be used to place individual LED chips into the grid openings, using the grid as fiducia.

Figure 5:
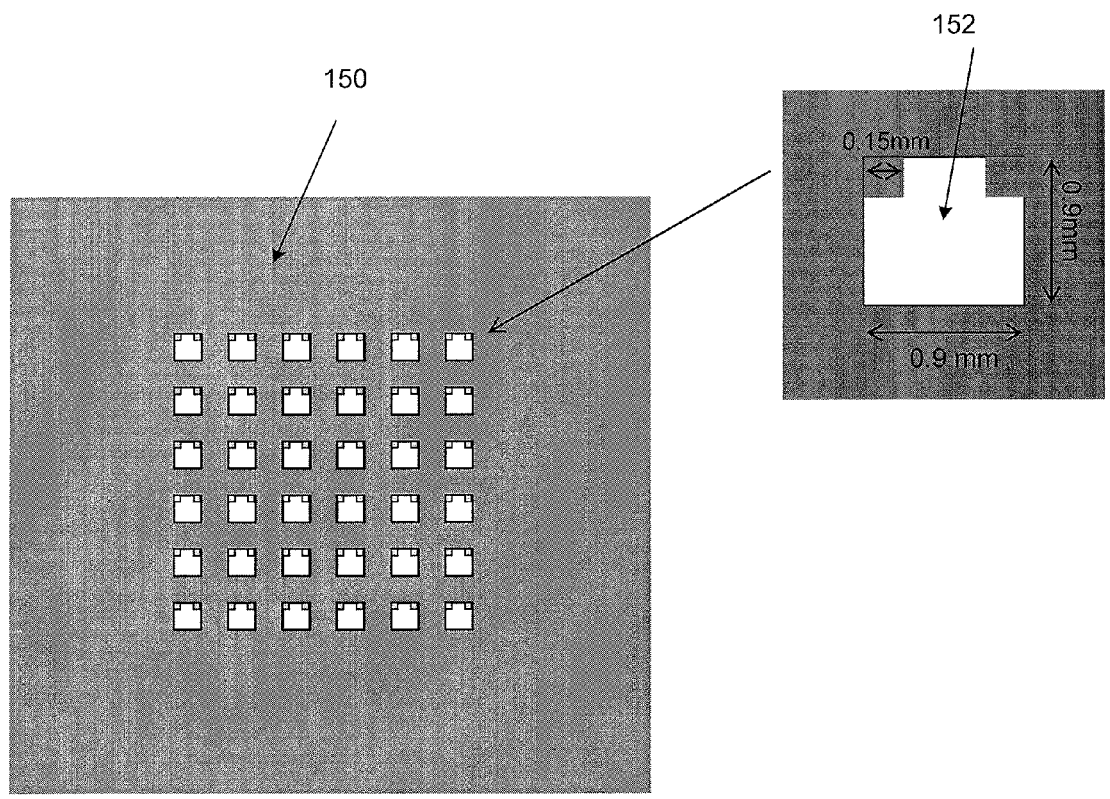
Figure 5:
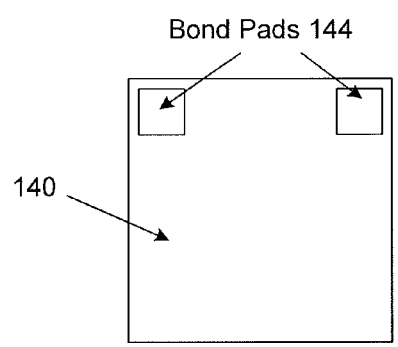

In FIG. 5, a stencil 150 is placed over the template and the LED chips in the openings of the template. The pattern of the stencil opening over the LED chip is shown as 152, which exposes top area of the LED chip 140 except the bond pad locations 144. As described below, the exposed areas of the top surface of the LED chips are ready to receive a phosphor coating. In this example, stencil 150 can be made of metal or an insulating material and is coated with TEFLON®, also known as Polytetrafluoroethylene (PTFE) which is a synthetic fluoropolymer of tetrafluoroethylene. The openings in stencil 150 correspond to the chip locations on the tape. The opening is slightly smaller than the chip size. The plate thickness is about 2 mil (the thickness of phosphor layer). Before it is used to print phosphor/silicone, the stencil can be coated with anti-stick solution, for example, LS-2233.

Figure 6:
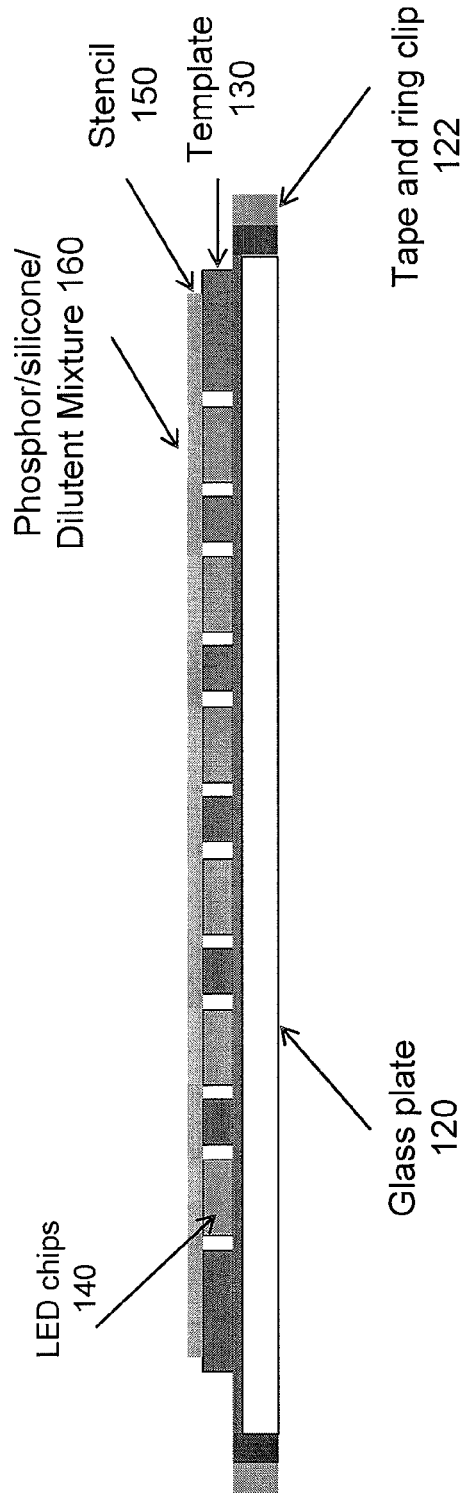

In FIG. 6, a phosphor containing mixture 160 is deposited over the stencil. For example, the mixture can be prepared by mixing silicone (e.g., Ker2500), phosphors (e.g., yellow and red phosphors), and diluting solution (e.g., KF-994, cyclotetrasiloxane) to achieve proper viscosity and thixotropy. Here, the mixture can have a higher viscosity that the mixture used in conventional liquid dispensing methods. Therefore, changes in the phosphor mixture caused by settling can be reduced. After the phosphor mixture is applied, a degas procedure can be used to remove bubbles. The mixture is then rolled over stencil and print. After printing, excess silicone/phosphor/diluent mixture is removed from the stencil. The thickness of the stencil allows a controlled thickness of the phosphor mixture on the die top.

Figure 7:
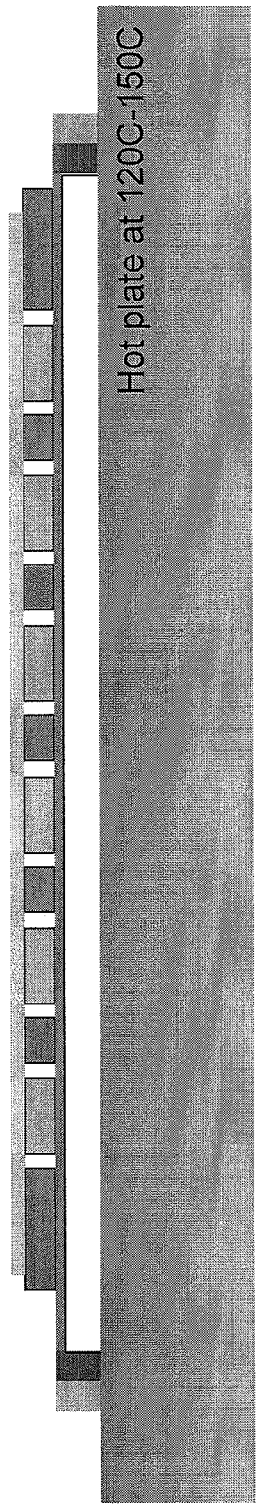

FIG. 7 shows the intermediate structure including a glass plate 120, a template 130 over the plate, LED chips 140 disposed in openings in the template, a stencil 150 with a phosphor-containing mixture 160 filling the openings in the stencil and over the exposed top surface of the LED chips. This intermediate structure is placed over a hot plate to cure the silicone at 120-150 C for 2 minutes. During curing, the stencil is maintained at the printing position so silicone does not flow and cover the wire bond pads, until silicone/phosphor/diluent mixture is dried.

Figure 8:
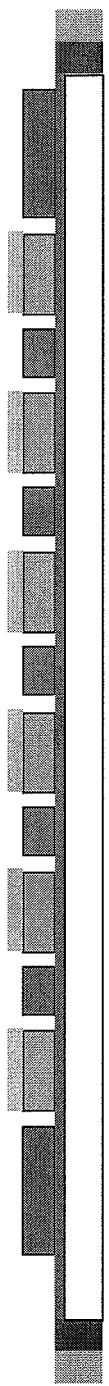
Figure 9:
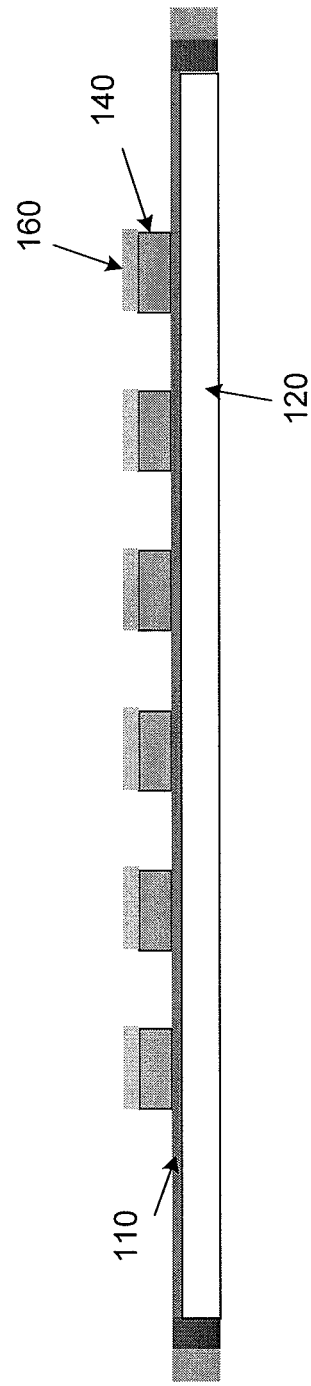

In FIG. 8, the stencil is removed. Because the stencil is coated with Teflon TEFLON®, also known as Polytetrafluoroethylene (PTFE) which is a synthetic fluoropolymer of tetrafluoroethylene, and anti-stick material, the stencil may be removed without taking the dried silicone/phosphor with it. In FIG. 9, the template is removed. If a thermal release tape is used underneath the stencil, the stencil can be removed after heating up the glass plate at 170C. For UV release tape, the structure is exposed to UV from the back side. As shown in FIG. 9, each individual LED die is now covered with a layer of phosphor-containing mixture.

A structure shown in FIG. 9 includes a plurality of separate LED dies 140 attached to an adhesive tape 110, each of the LED dies having a layer of phosphor-containing material 160 on the die top. At this time, a standard assembly process, e.g., using a pick-and-place tool, can be used to install the phosphor-coated LED dies in an emitter package.

Figure 10:
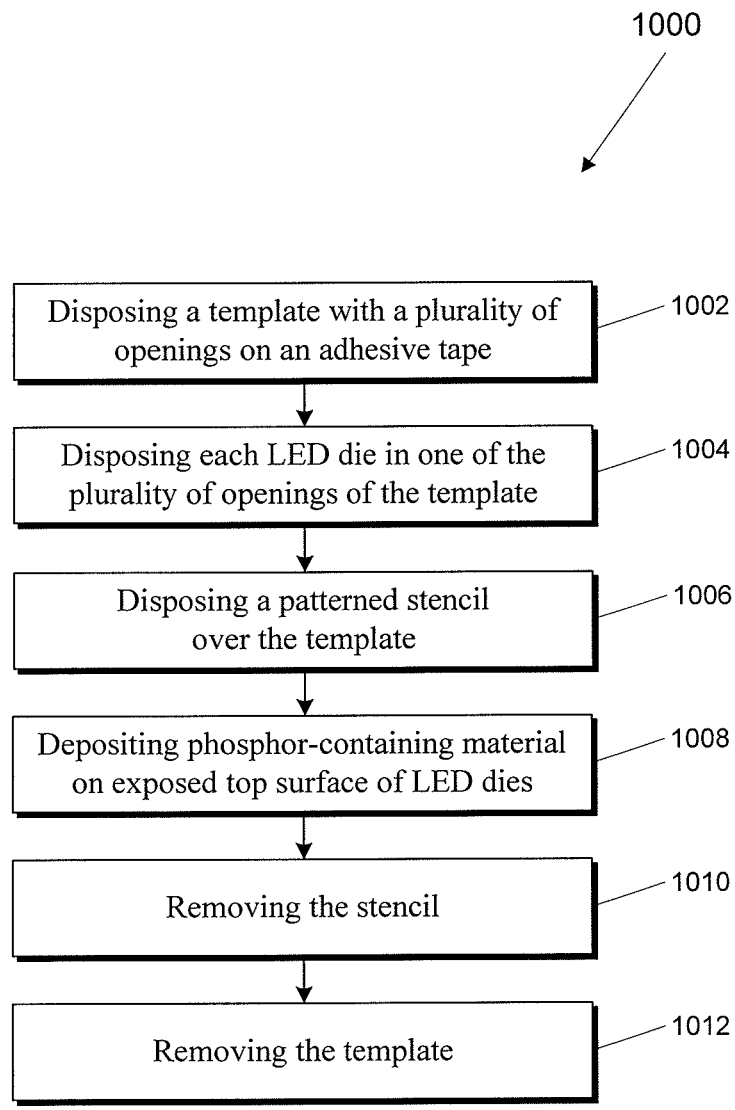
FIG. 10 shows a flowchart summarizing the method for depositing a layer of phosphor-containing material on a plurality of LED dies according to an embodiment of the present invention.

FIG. 10 is a flowchart summarizing a method for depositing a layer of phosphor-containing material on a plurality of LED (light-emitting diode) dies according to an embodiment of the present invention. As shown in FIG. 10, the method includes the following processes:
  disposing a template with a plurality of openings on an adhesive tape;
  disposing each of a plurality of LED dies in one of the plurality of openings of the template;
  disposing a stencil over the template and the plurality of LED dies, the stencil having a plurality of openings configured to expose a top surface of each of the LED dies;
  depositing a phosphor-containing material on the exposed top surface of each the LED dies;
  removing the stencil; and
  removing the template.

An example of the method is described above in connection with FIGS. 1-9.

In this method, the process of depositing a phosphor-containing material on the top surface of each the LED dies includes:
  depositing the phosphor-containing material on the stencil and the LED dies; and
  removing phosphor-containing material from the top surface of the stencil and on the top surface of the LED dies that protrudes above the top surface of the template.

According to another embodiment of the invention, the template and the stencil in the above method can be combined into one template.

The methods described above are suitable for phosphor deposition before the die attach and wire bonding steps for the single color multi-die emitters. In some embodiments, after phosphor printing, each die is tested for light color. Two or more dies of opposite colors (with respect to the average color of all dies) may be selected and attached in a multi-die package.

Although the invention has been described with respect to specific embodiments, it will be appreciated that the invention is intended to cover all modifications and equivalents within the scope of the following claims.

What is claimed is:

1. A method for depositing a layer of phosphor-containing material on a plurality of LED (light-emitting diode) dies, the method comprising:
    disposing a template with a plurality of openings on an adhesive tape;
    after disposing the template on the adhesive tape, disposing each of the plurality of LED dies directly on the adhesive tape through a respective one of the plurality of openings of the template;
    after disposing the LED dies on the adhesive tape, disposing a stencil over the template and the plurality of LED dies, the stencil having a plurality of openings configured to expose a top surface of each of the LED dies;
    after disposing the stencil, depositing the phosphor-containing material on the exposed top surface of each of the LED dies;
    after depositing the phosphor-containing material, removing the stencil; and
    removing the template from the adhesive tape.

2. The method of claim 1, wherein the adhesive tape is placed on a glass plate.

3. The method of claim 1, wherein the adhesive tape is a heat release tape.

4. The method of claim 1, wherein the adhesive tape is a UV release tape.

5. The method of claim 1, wherein an area of one of the openings in the template is approximately equal to the size of a respective one of the LED dies.

6. The method of claim 1, wherein a thickness of one of the openings in the template is substantially equal to a thickness of a respective one of the LED dies.

7. The method of claim 1, wherein the stencil is configured to cover bond pad areas on each of the LED dies.

8. The method of claim 1, wherein a depth of each of the openings in the stencil is equal to a desired thickness of the phosphor-containing material.

9. The method of claim 1, wherein the stencil is coated with Polytetrafluoroethylene (PTFE) under the trademark of TEFLON®.

10. The method of claim 1, wherein the stencil is made of metal.

11. The method of claim 1, wherein the stencil is made of an insulator material.

12. A method for depositing a layer of phosphor-containing material on a plurality of LED (light-emitting diode) dies, the method comprising:
    disposing a template with a plurality of openings on an adhesive tape;
    after disposing the template on the adhesive tape, disposing each of the plurality of LED dies directly on the adhesive tape through a respective one of the plurality of openings of the template;
    after disposing the LED dies on the adhesive tape, disposing a metal stencil over the template and the plurality of LED dies, the stencil having a plurality of openings configured to expose a top surface of each of the LED dies;
    after disposing the stencil, depositing the phosphor-containing material on the exposed top surface of each of the LED dies;
    after depositing the phosphor-containing material, removing the metal stencil; and
    removing the template.

* * * * *